(12) United States Patent
Smith

(10) Patent No.: US 9,258,926 B2
(45) Date of Patent: Feb. 9, 2016

(54) SYSTEM AND METHOD FOR FLUID COOLING OF ELECTRONIC DEVICES INSTALLED IN A SEALED ENCLOSURE

(71) Applicant: David Lane Smith, Montgomery, TX (US)

(72) Inventor: David Lane Smith, Montgomery, TX (US)

(\*) Notice: Subject to any disclaimer, the term of this patent is extended or adjusted under 35 U.S.C. 154(b) by 0 days.

(21) Appl. No.: 14/749,615

(22) Filed: Jun. 24, 2015

(65) Prior Publication Data

US 2015/0373882 A1 Dec. 24, 2015

Related U.S. Application Data

(60) Provisional application No. 62/016,638, filed on Jun. 24, 2014, provisional application No. 62/060,290, filed on Oct. 6, 2014.

(51) Int. Cl.
*H05K 7/20* (2006.01)
*G06F 1/20* (2006.01)

(52) U.S. Cl.
CPC ............ *H05K 7/203* (2013.01); *H05K 7/20327* (2013.01); *H05K 7/20709* (2013.01); *H05K 7/20809* (2013.01); *H05K 7/20818* (2013.01)

(58) Field of Classification Search
CPC ................. H05K 7/202; H05K 7/208–7/20827
See application file for complete search history.

(56) References Cited

U.S. PATENT DOCUMENTS

| | | | | |
|---|---|---|---|---|
| 2,654,583 A | * | 10/1953 | Treanor | ................ H01F 27/085 165/104.34 |
| 3,200,881 A | * | 8/1965 | Bucks | ..................... F25D 31/00 165/104.21 |
| 3,270,250 A | | 8/1966 | Davis | |
| 3,406,244 A | * | 10/1968 | Oktay | ........................ F28C 3/04 165/104.13 |
| 3,524,497 A | | 8/1970 | Chu et al. | |
| 3,566,958 A | | 3/1971 | Zelina | |
| 3,623,546 A | * | 11/1971 | Banthin | .................... F01P 9/00 123/41.31 |
| 3,648,113 A | | 3/1972 | Rathjen et al. | |
| 3,737,728 A | | 6/1973 | Austin | |
| 3,865,183 A | | 2/1975 | Roush | |
| 4,188,996 A | | 2/1980 | Pellant et al. | |
| 4,203,129 A | | 5/1980 | Oktay et al. | |
| 4,590,538 A | | 5/1986 | Cray | |
| 4,847,731 A | | 7/1989 | Smolley | |
| 4,866,570 A | | 9/1989 | Porter | |
| 4,938,280 A | | 7/1990 | Clark | |
| 5,099,908 A | * | 3/1992 | Taraci | ................. G01R 31/2891 165/104.13 |
| 5,297,621 A | * | 3/1994 | Taraci | ................. G01R 31/2891 165/104.13 |
| 5,305,184 A | * | 4/1994 | Andresen | ................. H01L 23/44 165/104.33 |
| 5,373,417 A | * | 12/1994 | Barrett | ..................... H01L 23/42 165/80.4 |
| 5,773,755 A | * | 6/1998 | Iwatare | ................... H05K 7/202 174/17 VA |
| 5,832,988 A | * | 11/1998 | Mistry | ................... H05K 7/206 165/103 |
| 5,842,514 A | | 12/1998 | Zapach et al. | |
| 6,019,167 A | | 2/2000 | Bishop et al. | |
| 6,081,425 A | * | 6/2000 | Cheng | .................... H05K 7/202 165/122 |

(Continued)

*Primary Examiner* — Robert J Hoffberg

(57) ABSTRACT

A system and method for cooling electronic devices disposed with the innermost volume of a hollow-walled fluid-tight sealed enclosure. Thermally conductive fluids that fill one or more volumes within the hollow walls of said sealed enclosure may be circulated away from said sealed enclosure to an external heat exchange mechanism. The innermost volume of the sealed container contains one or more single phase or multi-phase dielectric thermally conductive fluids, which may be circulated passively by convection or actively by means of a pump, bubbler, fan, propeller or other means. Pressure balancing mechanisms may be included to maintain suitable pressure of gaseous fluid in the innermost volume of the sealed container.

30 Claims, 8 Drawing Sheets

(56) References Cited

U.S. PATENT DOCUMENTS

| | | | |
|---|---|---|---|
| 6,119,768 A * | 9/2000 | Dreier | H05K 7/206 165/103 |
| 6,125,036 A | 9/2000 | Kang et al. | |
| 6,434,935 B1 * | 8/2002 | Rammhofer | B60T 11/26 60/585 |
| 6,679,315 B2 | 1/2004 | Cosley et al. | |
| 7,258,161 B2 | 8/2007 | Cosley et al. | |
| 7,403,392 B2 | 7/2008 | Attlesey et al. | |
| 7,414,845 B2 | 8/2008 | Attlesey et al. | |
| 7,724,517 B2 | 5/2010 | Attlesey et al. | |
| 7,724,524 B1 | 5/2010 | Campbell et al. | |
| 7,911,782 B2 | 3/2011 | Attlesey et al. | |
| 7,911,793 B2 | 3/2011 | Attlesey | |
| 7,961,475 B2 | 6/2011 | Campbell et al. | |
| 8,009,419 B2 | 8/2011 | Attlesey et al. | |
| 8,014,150 B2 * | 9/2011 | Campbell | H05K 7/20809 165/104.33 |
| 8,018,720 B2 * | 9/2011 | Campbell | F28D 15/0266 165/104.33 |
| 8,072,752 B2 * | 12/2011 | Wantschik | H02B 1/565 312/223.1 |
| 8,089,764 B2 | 1/2012 | Attlesey | |
| 8,089,765 B2 | 1/2012 | Attlesey | |
| 8,089,766 B2 | 1/2012 | Attlesey | |
| 8,174,826 B2 | 5/2012 | El-Essawy et al. | |
| 8,184,436 B2 | 5/2012 | Campbell et al. | |
| 8,203,842 B2 | 6/2012 | Campbell et al. | |
| 8,305,759 B2 | 11/2012 | Attlesey | |
| 8,351,206 B2 | 1/2013 | Campbell et al. | |
| 8,369,090 B2 | 2/2013 | Chester et al. | |
| 8,369,091 B2 | 2/2013 | Campbell et al. | |
| 8,416,572 B2 | 4/2013 | Olsen et al. | |
| 8,467,189 B2 | 6/2013 | Attlesey | |
| 8,554,390 B2 | 10/2013 | Canney et al. | |
| 8,654,529 B2 | 2/2014 | Attlesey | |
| 2007/0034360 A1 * | 2/2007 | Hall | G06F 1/183 165/104.33 |
| 2008/0302115 A1 * | 12/2008 | Eknes | H05K 5/068 62/183 |
| 2011/0132579 A1 | 6/2011 | Best et al. | |
| 2013/0146273 A1 | 6/2013 | Chester et al. | |
| 2014/0124174 A1 * | 5/2014 | Campbell | F28F 3/048 165/104.31 |
| 2014/0321053 A1 * | 10/2014 | Donnelly | H05K 7/20236 361/691 |
| 2015/0000319 A1 | 1/2015 | Smith | |
| 2015/0013940 A1 | 1/2015 | Best et al. | |

* cited by examiner

SYSTEM AND METHOD FOR FLUID COOLING OF ELECTRONIC DEVICES INSTALLED IN A SEALED ENCLOSURE

RELATED APPLICATION

This application claims the priority of U.S. Provisional 62/016,638, filed on Jun. 24, 2014 and entitled "FLUID COOLING OF ELECTRONIC DEVICES INSTALLED IN A SEALED ENCLOSURE" and U.S. Provisional 62/060, 290, filed on Oct. 17, 2014 and entitled "APPARATUS AND METHOD FOR FLUID COOLING OF ELECTRONIC DEVICES INSTALLED IN AN ENCLOSURE" all of which are hereby incorporated by reference in their entirety.

TECHNICAL FIELD

This disclosure relates to a system and method for cooling electronic devices, including but not limited to computer systems, by installing the electronic devices in a fluid-tight enclosure, said enclosure constructed with hollow walls which provide for electronic device cooling by circulating fluid into and out of the hollow spaces within the walls of the enclosure.

BACKGROUND

Electronic devices generate significant amounts of thermal energy during operation. The functional lifetime of electronic devices is significantly diminished by excess heat buildup. Therefore, a number of methods have been presented to remove thermal energy from electronic devices and reject it into an external environment. Since the beginnings of electronic devices, air movement over these devices has been the primary means of heat removal. For example, in the early large-scale computing systems of the 1940s and 1950s, heat dissipation consisted primarily of ventilation apertures in housings, followed by ambient-air fans and blowers which cooled by forced air convection. Even today, refined versions of these early air-based heat dissipation systems are the most common means of electronic device and computer systems cooling. In air-based heat dissipation systems, air within a device enclosure is heated by the electronic device and internal fans expel heated air into the immediate environment around the device. The environment around the device is typically maintained with regards to temperature, humidity, and particulate matter, by using compression-based heat exchange with the outside environment. This process is effective and in common use for non-stop electronic devices such as computer servers. Although this process is effective, it is complex process with a number of systems that must be constantly maintained to produce the desired environment thus having high construction and operational costs. For example, air-based cooling relies on a) the proper operation of fans to circulate air inside the device enclosure, in the server room, and in outside condensers, b) a very clean environment free of most dust and particulates, c) proper humidity control, and d) costly "white space" in the server room to allow human access to electronic devices for repair and maintenance. Air based cooling faces significant risks from a) internal fan and cooling failures, b) server room cooling failures and inconsistencies, c) fire control systems, d) unauthorized human access, e) maintenance failures and mistakes, and f) natural disasters. Taken together, these factors typically require specialized and costly installation space for electronic devices such as computer servers. Further, air-based cooling of electronic systems can double the total amount of electrical energy required to operate these systems, resulting in a costly and wasteful means of operating such systems.

Noting the inefficiencies and problems with air-based heat dissipation, designs begin to arise in the 1960s and 1970s that took advantage of the much higher thermal conductivity of liquids, which typically conduct heat ten to one hundred times more rapidly than gases. Liquid vapor cooling of individual semiconductors and other solid state components was disclosed by Davis in U.S. Pat. No. 3,270,250, and in U.S. Pat. No. 3,524,497, Chu et. al. disclose a double-walled container for component-level electronics, with liquid flow in the space between the walls. The predominance of such designs focused on component level cooling of larger systems.

As individual CPU processing speed and power increased during the 1980s, inventors continued to disclose methods for additional cooling capability in electronic assemblies. Many of these disclosures related to component level cooling, but a few began to focus on system level liquid cooling. Cray, in U.S. Pat. No. 4,590,538 (1986), discloses a means of immersing an entire electronic assembly in coolant liquid, and circulating the liquid out of the assembly container for the purpose of thermal energy removal. Numerous other methods of liquid cooling of components and component assemblies continued to be disclosed throughout the 1990s. In the late 2000s, the liquid cooling designs from the 1980s and 1990s were applied to individual servers and computing systems. These innovations were followed by modifications and improvements which incorporated liquid cooling elements into the structural design of computing systems rather than individual modules or computing units. For example, in U.S. Pat. No. 8,351,206, Campbell et. al. disclose a liquid-cooled electronics rack with immersion-cooled electronics and a vertically mounted vapor condensation unit attached to or adjacent to the electronics rack.

Olsen, et. al. describe in U.S. Pat. No. 8,416,572 a design for multiple electronic devices connected in an array, thermally coupled to a flowing liquid. In U.S. Pat. No. 8,467,189 and related following patents Attlesey discloses designs for an array of rack-mounted plurality of cases for electronics systems; each case contains a dielectric fluid for heat conduction, and the rack system incorporates a manifold for liquid circulation through the plurality of cases, with a pump and heat exchanger incorporated into the fluid circulation loop. Best et. al. disclose, in U.S. Patent Application 2011/0132579 a design in which a series of horizontally oriented computer server racks are submerged in a liquid tank containing a dielectric cooling fluid that is circulated from the tank to a remote heat exchanger and back into the tank.

One of the significant improvements of liquid cooling over air cooling is the ability to transport heat from the electronic device or system directly to the heat rejection environment without significantly affecting the human inhabited space in the server room thus dramatically increasing the heat transport efficiency while reducing the number of cooling processes and preventing excess heat diffusion. However, these processes have not seen widespread adoption for one or more possible reasons. Component level liquid cooling designs tend to introduce significant complexity to operations and maintenance while increasing server room risks to coolant leaks and failures. System level liquid cooling designs reduce the overall number of cooling interconnects, but have similar problems. To further complicate the liquid cooling server room installations, liquid cooled systems require new server room procedures, operations, and training and expose owner and operators to additional liabilities from liquid damage. And notably, production electronic devices and servers are rarely available in liquid cooling configurations. Succinctly, the cost savings associated with current liquid cooling designs are overshadowed by the increased costs of purchasing, constructing, and operating liquid cooled servers and solutions.

Significantly, it is the widespread usage of virtualized computing resources that is allowing greater innovation and deployment of fluid cooled electronic devices and servers. Virtualization of data resources allows data to be stored on many redundant devices. Virtualization of compute resources allows the functional compute unit of a "server" to become a software unit that can be moved from one physical computer to another. Individual electronic devices and servers may fail over time, but the virtualized nature of software based compute and storage units mean that an individual failures only slightly decreases the overall capability of a collection of servers but in no way compromises the data processing, storage, and communication functions as a whole. Therefore, since it is no longer necessary to maintain or repair a specific physical server in order to maintain a given operation, fluid cooling of electronic devices in a sealed enclosure is enabling cost reductions, operational efficiencies, increased security, and extended longevity of electronic devices and servers.

The innovations as disclosed herein overcome problems inherent to both traditional air-cooled and liquid-cooled electronic devices and systems. Significant benefits comprise a) high efficiency cooling and heat exchange reducing overall energy usage by up to 50%, b) no maintenance required, c) devices and systems can be installed in almost any environment such as a traditional data center, high rise office, industrial building, offshore installation, underground installation, and ambient air data center, d) increasing server density up to 3× the current high-density server deployments thus reducing the amount of server room space required, e) improved physical security, f) improved EMI/RFI security, g) decreased labor costs, h) more protection against disasters such as fire, hurricane, and earthquake, i) fewer maintenance failures and mistakes, j) tamper-resistant to unauthorized human access, k) reduced or eliminated damage due to fire control systems, l) nearly silent in operation, m) internal components have cooler average temperature that will increase the life of the system, and n) impervious to environmental factors such as dust and humidity.

These and other benefits disclosed herein combine together to create entirely new classes of solutions. For example, innovation in the fluid cooling of electronic devices as disclosed herein, and innovations that allow for a broader range of installation environments are disclosed by Smith in U.S. Patent Appl. No. 2015/0000319 (January 2015) are challenging the assumptions and designs of data centers and server rooms.

Unless specifically stated as such, the preceding is not admitted to be prior art and no statement appearing in this section should be interpreted as a disclaimer of any features or improvements listed.

BRIEF DESCRIPTION OF THE INVENTION

Various embodiments of a system and method for fluid cooling of electronic devices installed in sealed enclosures are disclosed herein.

At least one embodiment described herein provides a cooling system for electronic devices installed in a sealed enclosure. Such embodiments are optimized for effective and efficient direct and indirect transfer of thermal energy away from heat-generating electronics into the surrounding environment. Designs embody enclosing structures comprised of walls that enclose an interior sealed space containing heat generating components and a dielectric thermally conductive fluid ("primary dielectric thermally conductive fluid"). Such walls are comprised of inner, outer, and optional intermediate walls such that additional and distinct thermally conductive fluids ("secondary thermally conductive fluids") are circulated within the enclosure walls to an external local or remote heat exchange loop. The sealed enclosure may be located in a variety of environments comprising limited to, raised or slab floor datacenters, commercial buildings, residential buildings, outdoor locations, subsurface structures, and direct subsurface installation. The design leads to significant reductions in capital, infrastructure, power, cooling, maintenance, and operational costs associated with deploying computing hardware. In addition, the design provides for a high degree of physical, electrical, and magnetic security for the enclosed electronics.

The sealed enclosure comprises a unit with innermost volume formed by a plurality of walls which form one or more enclosing volumes within said walls. The innermost volume contains a single phase or multi-phase primary dielectric thermally conductive fluid in which electronic devices to be cooled are immersed and/or surrounded. Located between any two surfaces of the enclosure walls are structures that comprise one or more channels that contain a single phase or multi-phase thermally conductive fluid ("secondary thermally conductive fluids"). Innermost and intermediate walls are thermally conductive and are optimized by composition and construction to provide for optimal heat transfer away from the innermost volume. The outermost exterior walls may be thermally conductive or thermally insulating. The sealed enclosure has fluid-tight entrances from the outermost surface to the innermost volume for power, networking, and other control and monitoring signals and functions. In addition, the sealed enclosure may optionally comprise fluid-tight entrances from the outermost surface to the innermost volume for gaseous fluid exchange with the innermost volume for the purpose of pressure equalization, fluid maintenance, and/or supplying motive force to kinetic process components located in said innermost volume.

Electronic devices may be disposed within the interior of the sealed enclosure in a variety of configurations to facilitate thermal transfer and best practice process efficiency. The enclosed electronic devices dissipate internally generated heat into the innermost volume, the primary dielectric thermally conductive fluid, and the innermost thermally conductive walls of the sealed enclosure. Heat is transported from the innermost surface of the walls of the sealed enclosure to one or more secondary thermally conductive fluids within the walls of the enclosure. The walls of the enclosure may be thermally connected by mechanical connection or other means. Cooling fins may be affixed to any wall surfaces to aid in heat transport and dissipation.

Located between any two surfaces of the enclosure walls are structures that contain a secondary thermally conductive fluid. Some embodiments may use multiple enclosed and segregated secondary thermally conductive fluids by using intermediate walls for the purpose of optimizing the thermal requirements. Secondary thermally conductive fluid(s) may be presented to one or more heat exchange mechanisms for the purpose of removing heat from the fluid(s). Heat exchange may be accomplished by a variety of means to one or more external heat sink systems that may be of various types including ventilation, compression, evaporation, absorption, or geothermal systems. The heat exchange system may reject heat directly into the immediate environment of the sealed enclosure via passive or forced circulation, or fluid may be circulated away from the sealed enclosure, cooled in a remote location, and then re-circulated back to the sealed enclosure at a lower temperature.

Various and diverse thermally conductive fluids may be used to support the cooling of electronic devices within a sealed enclosure at a particular thermodynamic rate. For example, an embodiment could use a multi-phase thermally conductive fluid that allows rapid dissipation of the heat from high temperature electronic devices such as a computer with CPUs while other embodiments could use a single phase thermally conductive fluid for general heat transfer of lower powered electronic devices.

Multiple configuration options are described to optimize installation of sealed enclosures into a variety of environments, such as homes, offices, businesses, datacenters, and specialty computing installations. The installation can be in any orientation and can be located in surface or sub-surface environments. Sealed enclosures be installed as standalone units or may be stacked or grouped together to form a single structural unit of any dimensionality in a high-density configuration.

In general, the sealed enclosure described contains no user serviceable electronic devices. The devices are typically used until they are no longer useful at which point they are completely replaced. Typically these units are deployed in multiples and utilize system designs that allow for redundant failover of non-functioning devices.

To enhance the security of the electronic devices in the sealed enclosure, a functional "poison pill" system may be implemented to provide an electrical, magnetic, chemical, and/or mechanical means of rendering the electronic devices and any content stored on those devices to be permanently unusable and unreadable.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of the claims.

BRIEF DESCRIPTION OF FIGURES

The features characteristic of the invention are set forth in the claims. However, the invention itself and further objectives and advantages thereof, will best be understood by reference to the following detailed description when read in conjunction with the accompanying drawings in which the left-most significant digit(s) in the reference numerals denote(s) the first figure in which the respective reference numerals appear, wherein:

DETAILED DESCRIPTION

Although described with reference to certain embodiments, those with skill in the art will recognize that the disclosed embodiments have relevance to a wide variety of areas in addition to those specific examples described below. Further, elements from one or more embodiments may be used in other embodiments and elements may be removed from an embodiment and remain within the scope of this disclosure.

All references, including publications, patent applications, and patents, cited herein are hereby incorporated by reference to the same extent as if each reference were individually and specifically indicated to be incorporated by reference and were set forth in its entirety herein; provided, however, to the extent there exists a conflict between this disclosure and a document incorporated by reference, this disclosure shall control.

As referenced herein, the terms "sealed enclosure" and "containment vessel" are used interchangeably.

As referenced herein, the terms "electronic device", "electronic devices", "computer", "computer systems", "computer cluster", "physical computer", "computer server", and "server" are used interchangeably, and unless otherwise specified comprise any electronic components that are configured to function as one or more independent electronic systems.

As referenced herein, a single phase thermally conductive fluid is defined as a liquid or a gas that remains in a single phase, either liquid or gas, across the entire range of operational temperatures and pressures of the electronic devices and/or systems disposed within the sealed enclosure.

As referenced herein, a multi-phase thermally conductive fluid is defined as a fluid that changes phase from a liquid to a gas at a temperature and pressure within the range of operational temperatures and pressures of the electronic devices and/or systems disposed within the sealed enclosure.

Figure 1:
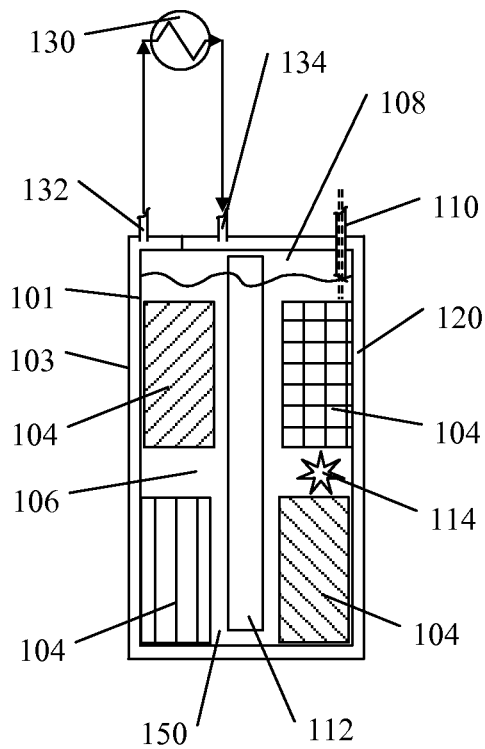
FIG. 1 shows a conceptual view of a sealed enclosure design comprising outermost and innermost enclosure walls that enclose electronic devices and a primary dielectric thermally conductive fluid in the innermost volume and a secondary thermally conductive fluid within the walls according to an embodiment of the disclosed subject matter.

FIG. 1 shows a conceptual view of a sealed enclosure design comprising innermost enclosure wall 101 and outermost enclosure wall 103 that enclose electronic devices 104 and a primary dielectric thermally conductive fluid 106 in the innermost volume 150 and a secondary thermally conductive fluid 120 within the volume between the innermost enclosure wall 101 and outermost enclosure wall 103. The innermost volume 150 contains a single phase or multi-phase primary dielectric thermally conductive fluid 106 in which electronic devices 104 to be cooled are immersed or surrounded. The single phase or multi-phase primary dielectric thermally conductive fluid 106 may be in a predominately liquid phase, gaseous phase, or in a combination liquid phase and gaseous phase. In an embodiment that comprises a single phase primary dielectric thermally conductive fluid 106 in the gaseous phase, said fluid will fill the entirety of innermost volume 150. In an embodiment that comprises a single phase primary dielectric thermally conductive fluid 106 in the liquid phase, said fluid may fill the entirety of innermost volume 150 or may fill less than the entirety of innermost volume 150 with the remaining volume filled by a separate and distinct fluid in the gaseous phase 108. In an embodiment that comprises a multi-phase primary dielectric thermally conductive fluid 106, said fluid will fill the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. Embodiments of the disclosed sealed enclosure may be configured with single phase or multi-phase thermally conductive fluids. A single phase thermally conductive fluid will transfer heat using the principles of convection and conduction. A multi-phase thermally conductive fluid will transfer heat using the principles of convection, conduction, and phase change. As the multi-phase thermally conductive fluid in the liquid phase absorbs heat, a portion of said fluid is converted to the gaseous phase. Conversely, as the multi-phase thermally conductive fluid in the gaseous phase gives up heat by various heat exchange processes, a portion of said multi-phase thermally conductive fluid in the gaseous phase condenses back into multi-phase thermally conductive fluid in the liquid phase. If the amount of multi-phase thermally conductive fluid in the gaseous phase exceeds the volume of space internal to the sealed enclosure that is unoccupied by the multi-phase thermally conductive fluid in the liquid phase, said multi-phase thermally conductive fluid in the gaseous phase will exert a positive pressure inside the volume of the sealed enclosure. Conversely, if the amount of multi-phase thermally conductive fluid in the gaseous phase is less than the volume of space internal to the sealed enclosure that is unoccupied by the multi-phase thermally conductive fluid in the liquid phase, said multi-phase thermally conductive fluid in the gaseous phase will exert a negative pressure inside the volume of the sealed enclosure. In addition, some amount of multi-phase thermally conductive fluid in the gaseous phase may exist in a space of the sealed enclosure for various purposes comprising cushioning positive and negative pressures in the sealed enclosure, displacing thermally conductive fluid to allow weight adjustments to the overall sealed enclosure, and/or allowing accumulation of gaseous fluid used to drive internal kinetic processes or gaseous based mixing functionality. A single phase thermally conductive fluid may either completely or partially fill a space of the sealed enclosure and any space in the sealed enclosure that is not filled by said single phase thermally conductive fluid may be filled with a distinct and suitable compressible gaseous fluid for various purposes comprising cushioning positive and negative pressures in the sealed enclosure, displacing thermally conductive fluid to allow weight adjustments to the overall sealed enclosure, and/or allowing accumulation of gaseous fluid used to drive internal kinetic processes or gaseous based mixing functionality. The walls of the sealed enclosure are constructed with innermost enclosure wall 101 and outermost enclosure wall 103 and connected to form channels around the innermost enclosure walls 101 such that additional and distinct thermally conductive fluid 120 may be circulated within the volume contained between said enclosure walls to an external local or remote heat exchanger assembly 130 via connecting lines 132, 134. The secondary single phase or multi-phase thermally conductive fluid 120 may be in a predominately liquid phase, gaseous phase, or in a combination liquid phase and gaseous phase. In an embodiment that comprises a secondary single phase thermally conductive fluid 120 in the gaseous phase or the liquid phase, said fluid will fill the entirety of the space between the innermost enclosure wall 101 and outermost enclosure wall 103. In an embodiment that comprises a secondary multi-phase thermally conductive fluid 120, said fluid will fill the entirety of the space between the innermost enclosure wall 101 and outermost enclosure wall 103 with portions of said fluid existing in the liquid phase and portions of said fluid existing in the gaseous phase in varying proportions relative to the temperature, pressure, and composition of said secondary multi-phase thermally conductive fluid 120. Electronic devices 104 may be disposed within the innermost volume 150 of the sealed enclosure in a variety of configurations to facilitate thermal transfer and best practice process efficiency. The enclosed electronic devices 104 dissipate internally generated heat into the innermost volume 150, the primary dielectric thermally conductive fluid 106, and the innermost thermally conductive walls 101 of the sealed enclosure. Heat is transported from the innermost enclosure wall 101 of the sealed enclosure to one or more secondary thermally conductive fluids 120 within the walls 101, 103 of the enclosure. The secondary thermally conductive fluid 120 is circulated between the walls 101, 103 where heat is transferred to the secondary thermally conductive fluid 120 and the outermost enclosure wall 103. The secondary thermally conductive fluid 120 is circulated out of the sealed enclosure via a fluid-tight piping connection 132, is presented to one or more heat exchanger assemblies 130 for the purpose of removing heat from the fluid, and returned to the sealed enclosure via a fluid-tight piping connection 134. The secondary thermally conductive fluid 120: a) is circulated within the walls 101, 103 of the sealed enclosure where internal heat is absorbed; b) is removed from within the walls 101, 103 of the sealed enclosure and circulated through an adjacent heat exchange assembly 130 where heat is removed from the thermally conductive fluid 120; and c) is returned to within the walls 101, 103 of the sealed enclosure. The secondary thermally conductive fluid 120 is continuously circulated in such a fashion as to provide constant heat removal from the sealed enclosure. Heat exchange may be accomplished by a variety of means to one or more external heat sink systems that may be of various types including ventilation, compression, evaporation, and geothermal systems. The heat exchange system may reject heat directly into the immediate environment via passive or forced circulation, or the fluid may be circulated away from the sealed enclosure, cooled in a remote location, and then re-circulated back to the sealed enclosure at a lower temperature. The innermost enclosure wall 101 is thermally conductive and is optimized by composition and construction to provide for optimal heat transfer away from the innermost volume 150. The outermost enclosure wall 103 may thermally conductive or thermally insulating. The walls 101, 103 of the enclosure may be thermally connected by mechanical connection or other means. Cooling fins may be affixed to the wall surfaces 101, 103 to aid in heat transport and dissipation. The sealed enclosure has fluid-tight entrances 110 from the outermost surface to the innermost volume 150 for power, networking, and other control and monitoring signals and functions which are appropriately connected to one or more electronic or other functional devices disposed in the innermost volume 150 of the sealed enclosure. The sealed enclosure may optionally comprise pressure balancing, fluid maintenance, and/or fluid circulation functionality as described in FIG. 3, 4, 5, 6, 7. Embodiment variations and details described herein apply equally to sealed enclosures with or without an interior 108 fluid head space. The sealed enclosure may be located either adjacent to or remote from any heat exchange assemblies 130 and/or pressure balancing systems and appropriate fluid transport channels between said locations are selected based optimal fluid flow and thermodynamic designs for the selected fluids. Further, any heat exchange assemblies 130 and/or pressure balancing systems may perform their indicated functions for one or more sealed enclosures. The sealed enclosure may optionally comprise one or more channels 112 disposed in the innermost volume 150 for the purpose of providing for increased convective circulation of the of single phase or multi-phase primary dielectric thermally conductive fluid 106 within the innermost volume 150 of the sealed enclosure. Such channels 112 disposed in the innermost volume 150 of the sealed enclosure encourage convective separation of the warmer single phase or multi-phase primary dielectric thermally conductive fluid 106 that tends to flow upward in the innermost volume 150 of the sealed enclosure and the cooler single phase or multi-phase primary dielectric thermally conductive fluid 106 that tends to flow downward in the innermost volume 150 of the sealed enclosure. The sealed enclosure may optionally comprise one or more mechanisms 114 in the innermost volume 150 for the purpose of providing an electrical, magnetic, chemical, and/or mechanical means of rendering the electronic devices and any content stored on those devices to be permanently unusable and unreadable. Sealed enclosures can be installed in any orientation, placed as standalone units or stacked or grouped together to form a single structural unit of any dimensionality in a high-density configuration.

Figure 2:
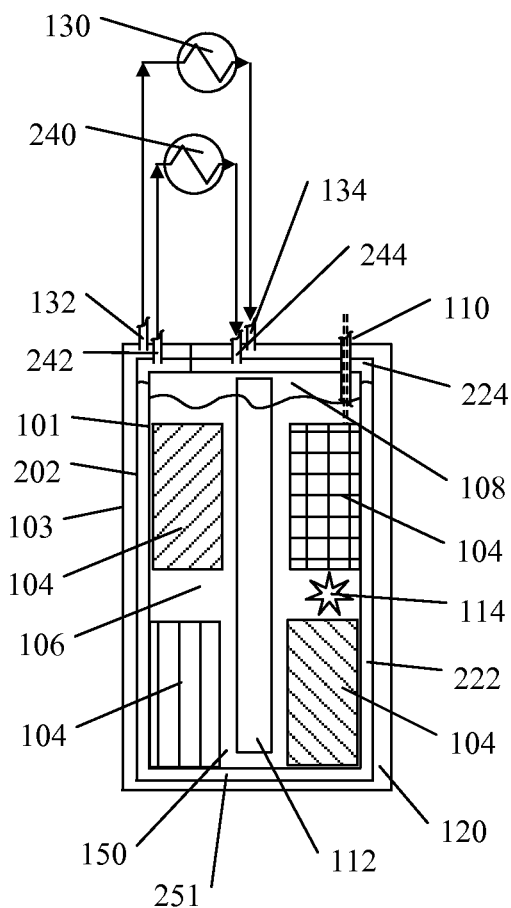
FIG. 2 shows a conceptual view of a sealed enclosure design comprising outermost, intermediate, and innermost enclosure walls that enclose electronic devices and a primary dielectric thermally conductive fluid in the innermost volume and one or more secondary thermally conductive fluids within the walls according to an embodiment of the disclosed subject matter.

FIG. 2 shows a conceptual view of a sealed enclosure design comprising innermost enclosure wall 101, intermediate enclosure wall 202, and outermost enclosure wall 103 that enclose electronic devices 104 and a primary dielectric thermally conductive fluid 106 in the innermost volume 150, a secondary thermally conductive fluid 120 within the volume between the intermediate enclosure wall 202 and outermost enclosure wall 103, and one or more secondary intermediate thermally conductive fluids 222 within the volume between the innermost enclosure wall 101 and intermediate enclosure wall 202. This embodiment is illustrated with a single intermediate enclosure wall 202 and secondary intermediate thermally conductive fluid 222, but other embodiments can contain multiple intermediate walls and fluids. The innermost volume 150 contains a single phase or multi-phase dielectric thermally conductive fluid 106 in which electronic devices 104 to be cooled are immersed or surrounded. The single phase or multi-phase primary dielectric thermally conductive fluid 106 may be in a predominately liquid phase, gaseous phase, or in a combination liquid phase and gaseous phase. In an embodiment that comprises a single phase primary dielectric thermally conductive fluid 106 in the gaseous phase, said fluid will fill the entirety of innermost volume 150. In an embodiment that comprises a single phase primary dielectric thermally conductive fluid 106 in the liquid phase, said fluid may fill the entirety of innermost volume 150 or may fill less than the entirety of innermost volume 150 with the remaining volume filled by a separate and distinct fluid in the gaseous phase 108. In an embodiment that comprises a multi-phase primary dielectric thermally conductive fluid 106, said fluid will fill the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. Embodiments of the disclosed sealed enclosure may be configured with single phase or multi-phase thermally conductive fluids. A single phase thermally conductive fluid will transfer heat using the principles of convection and conduction. A multi-phase thermally conductive fluid will transfer heat using the principles of convection, conduction, and phase change. As the multi-phase thermally conductive fluid in the liquid phase absorbs heat, a portion of said fluid is converted to the gaseous phase. Conversely, as the multi-phase thermally conductive fluid in the gaseous phase gives up heat by various heat exchange processes, a portion of said multi-phase thermally conductive fluid in the gaseous phase condenses back into multi-phase thermally conductive fluid in the liquid phase. If the amount of multi-phase thermally conductive fluid in the gaseous phase exceeds the volume of space internal to the sealed enclosure that is unoccupied by the multi-phase thermally conductive fluid in the liquid phase, said multi-phase thermally conductive fluid in the gaseous phase will exert a positive pressure inside the volume of the sealed enclosure. Conversely, if the amount of multi-phase thermally conductive fluid in the gaseous phase is less than the volume of space internal to the sealed enclosure that is unoccupied by the multi-phase thermally conductive fluid in the liquid phase, said multi-phase thermally conductive fluid in the gaseous phase will exert a negative pressure inside the volume of the sealed enclosure. In addition, some amount of multi-phase thermally conductive fluid in the gaseous phase may exist in a space of the sealed enclosure for various purposes comprising cushioning positive and negative pressures in the sealed enclosure, displacing thermally conductive fluid to allow weight adjustments to the overall sealed enclosure, and/or allowing accumulation of gaseous fluid used to drive internal kinetic processes or gaseous based mixing functionality. A single phase thermally conductive fluid may either completely or partially fill a space of the sealed enclosure and any space in the sealed enclosure that is not filled by said single phase thermally conductive fluid may be filled with a distinct and suitable compressible gaseous fluid for various purposes comprising cushioning positive and negative pressures in the sealed enclosure, displacing thermally conductive fluid to allow weight adjustments to the overall sealed enclosure, and/or allowing accumulation of gaseous fluid used to drive internal kinetic processes or gaseous based mixing functionality. In one embodiment, the walls of the sealed enclosure are constructed with innermost enclosure wall 101, intermediate enclosure wall 202, and outermost enclosure wall 103 and connected to form channels around the innermost enclosure walls 101 such that additional and distinct thermally conductive fluids 222, 120 may be circulated within the volume contained between said enclosure walls to an external local or remote heat exchanger assembly 130, 240 via connecting lines 132, 134, 242, 244. In another embodiment, remote heat exchanger assembly 240 is optionally replaced by an embodiment that is comprised of pressure balancing, fluid maintenance, and/or fluid circulation functionality as described in FIG. 8. The secondary intermediate single phase or multi-phase thermally conductive fluid 222 may be in a predominately liquid phase, gaseous phase, or in a combination liquid phase and gaseous phase. In an embodiment that comprises a secondary intermediate single phase thermally conductive fluid 222 in the gaseous phase, said fluid will fill the entirety of the space between the innermost enclosure wall 101 and intermediate enclosure wall 202. In an embodiment that comprises a secondary intermediate single phase thermally conductive fluid 222 in the liquid phase, said fluid may fill the entirety of the space between the innermost enclosure wall 101 and the intermediate enclosure wall 202 or may fill less than the entirety of the space between the innermost enclosure wall 101 and intermediate enclosure wall 202 with the remaining volume filled by a separate and distinct fluid in the gaseous phase 224. In an embodiment that comprises a secondary intermediate multi-phase thermally conductive fluid 222, said fluid will fill the entirety of the space between the innermost enclosure wall 101 and intermediate enclosure wall 202 with portions of said fluid existing in the liquid phase 222 and portions of said fluid existing in the gaseous phase 224 in varying proportions relative to the temperature, pressure, and composition of said secondary intermediate multi-phase thermally conductive fluid 222. The secondary single phase or multi-phase thermally conductive fluid 120 may be in a predominately liquid phase, gaseous phase, or in a combination liquid phase and gaseous phase. In an embodiment that comprises a secondary single phase thermally conductive fluid 120 in the gaseous phase or the liquid phase, said fluid will fill the entirety of the space between the intermediate enclosure wall 202 and outermost enclosure wall 103. In an embodiment that comprises a secondary multi-phase thermally conductive fluid 120, said fluid will fill the entirety of the space between the intermediate enclosure wall 202 and outermost enclosure wall 103 with portions of said fluid existing in the liquid phase and portions of said fluid existing in the gaseous phase in varying proportions relative to the temperature, pressure, and composition of said secondary multi-phase thermally conductive fluid 120. Electronic devices 104 may be disposed within the innermost volume 150 of the sealed enclosure in a variety of configurations to facilitate thermal transfer and best practice process efficiency. The enclosed electronic devices 104 dissipate internally generated heat into the innermost volume 150, the primary dielectric thermally conductive fluid 106, and the innermost thermally conductive walls 101 of the sealed enclosure. Heat is transported from the innermost enclosure wall 101 of the sealed enclosure to a secondary intermediate thermally conductive fluid 222 within the walls 101, 202 of the enclosure. The secondary intermediate thermally conductive fluid 222 may optionally be circulated between the walls 101, 202 where heat is transferred to secondary intermediate thermally conductive fluids 222 and the intermediate enclosure wall 202. The secondary intermediate thermally conductive fluid 222 may optionally be circulated out of the sealed enclosure via a fluid-tight piping connection 242, is presented to one or more heat exchange assemblies 240 for the purpose of removing heat from the fluid, and returned to the sealed enclosure via a fluid-tight piping connection 244. Heat is transported from the intermediate enclosure wall 202 of the sealed enclosure to the secondary thermally conductive fluid 120 within the walls 202, 103 of the enclosure. The secondary thermally conductive fluid 120 is circulated between the walls 202, 103 where heat is transferred to the secondary thermally conductive fluid 120 and the outermost enclosure wall 103. The secondary thermally conductive fluid 120 is circulated out of the sealed enclosure via a fluid-tight piping connection 132, is presented to one or more heat exchange assemblies 130 for the purpose of removing heat from the fluid, and returned to the sealed enclosure via a fluid-tight piping connection 134. The secondary thermally conductive fluid 120: a) is circulated within the walls 103, 202 of the sealed enclosure where internal heat is absorbed; b) is removed from within the walls 103, 202 of the sealed enclosure and circulated through an adjacent heat exchange assembly 130 where heat is removed from the thermally conductive fluid 120; and c) is returned to within the walls 103, 202 of the sealed enclosure. The secondary thermally conductive fluid 120 is continuously circulated in such a fashion as to provide constant heat removal from the sealed enclosure. In the case of a sealed enclosure with one or more intermediate enclosure walls 202, each secondary intermediate thermally conductive fluid 222 may optionally be circulated from the sealed enclosure to an associated intermediate heat exchanger assembly 240. Further, if a sealed enclosure embodiment comprises both a secondary thermally conductive fluid 120 and one or more secondary intermediate thermally conductive fluids 222, then at least one of the said thermally conductive fluids is removed from the sealed enclosure, circulated through a heat exchanger assembly, and returned to the sealed enclosure. Heat exchange may be accomplished by a variety of means to one or more external heat sink systems that may be of various types including ventilation, compression, evaporation, absorption, and geothermal systems. The heat exchange system may reject heat directly into the immediate environment of the sealed enclosure via passive or forced circulation, or the fluid may be circulated away from the sealed enclosure, cooled in a remote location, and then re-circulated back to the sealed enclosure at a lower temperature. The innermost enclosure wall 101 and intermediate enclosure wall 202 are thermally conductive and are optimized by composition and construction to provide for optimal heat transfer away from the innermost volume 150. The outermost enclosure wall 103 may thermally conductive or thermally insulating. The walls 101, 202, 103 of the enclosure may be thermally connected by mechanical connection or other means. Cooling fins may be affixed to the wall surfaces 101, 202, 103 to aid in heat transport and dissipation. The sealed enclosure has fluid-tight entrances 110 from the outermost surface to the innermost volume 150 for power, networking, and other control and monitoring signals and functions which are appropriately connected to one or more electronic or other functional devices disposed in the innermost volume 150 of the sealed enclosure. The multi-wall sealed enclosure described herein may optionally comprise pressure balancing, fluid maintenance, and/or fluid circulation functionality as described in FIG. 3, 4, 5, 6, 7 in which the innermost enclosure wall 101 and outermost enclosure wall 103 describe optional functionality without reference to the intermediate enclosure wall 202. Further, the multi-wall sealed enclosure described herein may optionally comprise pressure balancing, fluid maintenance, and/or fluid circulation functionality as described in FIG. 8. Embodiment variations and details described herein apply equally to sealed enclosures with or without intermediate enclosure walls 202 and secondary intermediate thermally conductive fluids 222, and with or without an interior 108, 224 fluid head space. The sealed enclosure may be located either adjacent to or remote from any heat exchange assemblies 130, 240 and/or pressure balancing systems and appropriate fluid transport channels between said locations are selected based optimal fluid flow and thermodynamic designs for the selected fluids. Further, any heat exchange assemblies 130, 240 and/or pressure balancing systems may perform their indicated functions for one or more sealed enclosures. The sealed enclosure may optionally comprise one or more channels 112 disposed in the innermost volume 150 for the purpose of providing for increased convective circulation of the of single phase or multi-phase primary dielectric thermally conductive fluid 106 within the innermost volume 150 of the sealed enclosure. Such channels 112 disposed in the innermost volume 150 of the sealed enclosure encourage convective separation of the warmer single phase or multi-phase primary dielectric thermally conductive fluid 106 that tends to flow upward in the innermost volume 150 of the sealed enclosure and the cooler single phase or multi-phase primary dielectric thermally conductive fluid 106 that tends to flow downward in the innermost volume 150 of the sealed enclosure. The sealed enclosure may optionally comprise one or more mechanisms 114 in the innermost volume 150 for the purpose of providing an electrical, magnetic, chemical, and/or mechanical means of rendering the electronic devices and any content stored on those devices to be permanently unusable and unreadable. Sealed enclosures can be installed in any orientation, placed as standalone units or stacked or grouped together to form a single structural unit of any dimensionality in a high-density configuration.

Figure 3:
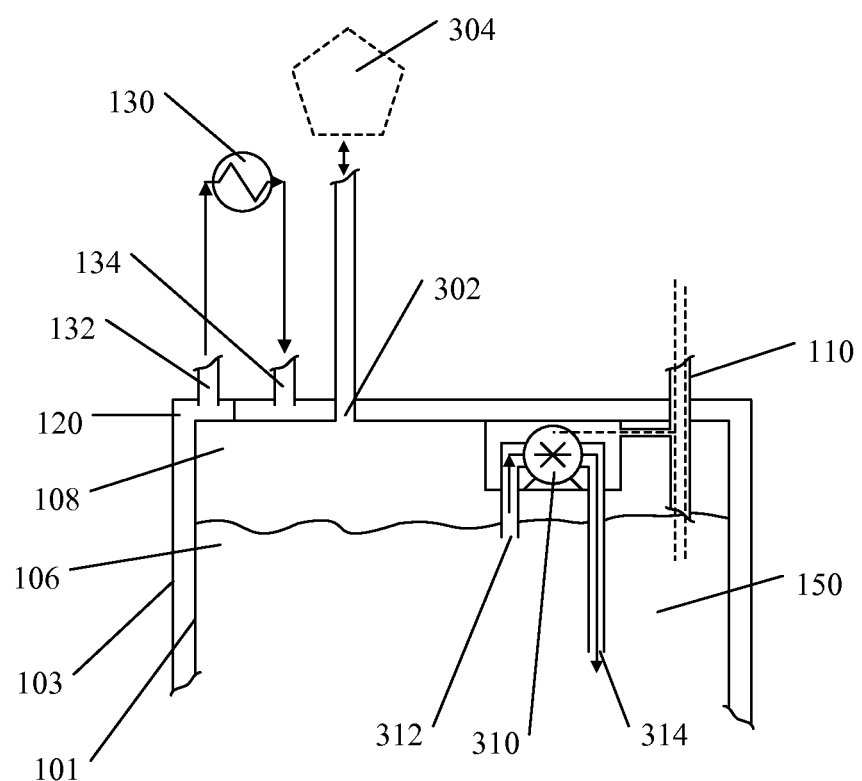
FIG. 3 shows a conceptual view of a single port pressure balancing mechanism used to relieve positive and negative pressures in a sealed enclosure and optional primary dielectric thermally conductive fluid pump circulation mechanisms according to an embodiment of the disclosed subject matter.

FIG. 3 shows a conceptual view of a single port pressure balancing mechanism used to relieve positive and negative pressures in a sealed enclosure and optional primary dielectric thermally conductive fluid pump circulation mechanisms. The sealed enclosure shown in the figure is typical of the disclosures described herein (FIG. 1, 2) and is illustrated by showing only a portion of such sealed enclosure as a figure with an innermost enclosure wall 101 and an outermost enclosure wall 103, wherein the innermost volume contains the primary dielectric thermally conductive fluid 106 that either completely or partially fills the interior of the sealed enclosure as shown. The fluid exchange sealed entrance assembly 302 allows primary dielectric thermally conductive fluid 106 fluid to be exchanged between the sealed enclosure and a pressure balancing system 304, maintaining a sealed enclosure environment and functioning for the purpose of pressure equalization of the innermost volume 150 of the sealed enclosure and providing optional fluid management. The fluid exchange sealed entrance assembly 302 and pressure balancing system 304 may be configured to function with any primary dielectric thermally conductive fluid, but is used advantageously in embodiments that contain a) a single phase primary dielectric thermally conductive fluid 106 in the liquid phase, said fluid filling less than the entirety of innermost volume 150 with the remaining volume filled by a separate and distinct fluid in the gaseous phase 108, b) a single phase thermally conductive fluid 106 in the gaseous phase, said fluid filling the entirety of innermost volume 150, or c) a multi-phase primary dielectric thermally conductive fluid 106, said fluid filling the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. The pressure balancing system 304 is an adjacently located or remote system that functions to maintain a suitably constant fluid presence and pressure to the fluid exchange sealed entrance assembly 302 for one or more sealed enclosures. The pressure balancing system 304 is capable of supplying pressure to or removing pressure from the sealed enclosure using a single fluid exchange sealed entrance assembly 302 via connecting lines. An extended surface configuration of the fluid exchange sealed entrance assembly 302 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed entrance assembly 302. Such extended surface configuration of the fluid exchange sealed entrance assembly 302 is cooled by the secondary thermally conductive fluid 120 that is returned from the secondary fluid heat exchanger 130 via connecting line 134 and flows over the extended surface configuration of the fluid exchange sealed entrance assembly 302. The flow of cooled secondary thermally conductive fluid 120 over the extended surface configuration of the fluid exchange sealed entrance assembly 302 serves to remove heat from the primary dielectric thermally conductive fluid 106, 108 that is transported through the fluid exchange sealed entrance assembly 302. This extended surface configuration of the fluid exchange sealed entrance assembly 302 may be utilized to condense the multi-phase primary dielectric thermally conductive fluid from the gaseous phase 108 back into the liquid phase 106, with the result of returning the multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure. Optional mechanisms may be additionally configured in the innermost volume 150 of the sealed enclosure in order to effect the circulation of the primary dielectric thermally conductive fluid 106 for the purpose of circulating the primary dielectric thermally conductive fluid in order to more effectively transfer thermal energy from the enclosed electronic devices 104 to the primary dielectric thermally conductive fluid 106 and the innermost enclosure wall 101, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 4:
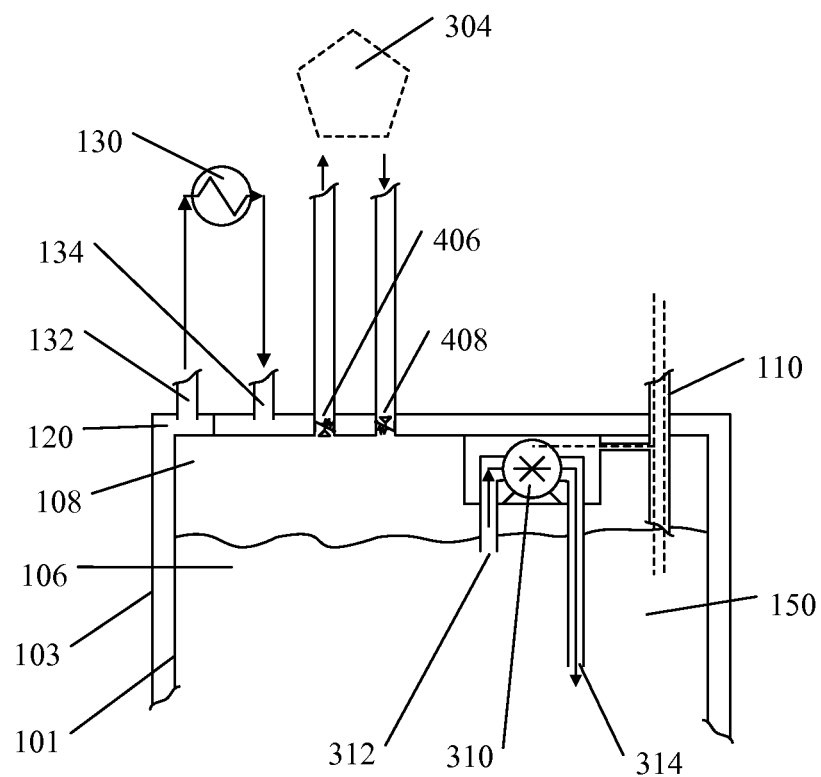
FIG. 4 shows a conceptual view of a dual port pressure balancing mechanism used to relieve positive and negative pressures in a sealed enclosure and optional primary dielectric thermally conductive fluid pump circulation mechanisms according to an embodiment of the disclosed subject matter.

FIG. 4 shows a conceptual view of a dual port pressure balancing mechanism used to relieve positive and negative pressures in a sealed enclosure and optional primary dielectric thermally conductive fluid pump circulation mechanisms. The sealed enclosure shown in the figure is typical of the disclosures described herein (FIG. 1, 2) and is illustrated by showing only a portion of such sealed enclosure as a figure with an innermost enclosure wall 101 and an outermost enclosure wall 103, wherein the innermost volume contains the primary dielectric thermally conductive fluid 106 that either completely or partially fills the interior of the sealed enclosure as shown. The fluid exchange sealed entrance assembly 408 and the fluid exchange sealed exhaust assembly 406 work in concert to allow primary dielectric thermally conductive fluid 106 fluid to be exchanged between the sealed enclosure and a pressure balancing system 304, maintaining a sealed enclosure environment and functioning for the purpose of pressure equalization of the innermost volume 150 of the sealed enclosure and providing optional fluid management. The fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of innermost volume 150 with the remaining volume filled by a separate and distinct fluid in the gaseous phase 108, b) a single phase thermally conductive fluid 106 in the gaseous phase, said fluid filling the entirety of innermost volume 150, or c) a multi-phase primary dielectric thermally conductive fluid 106, said fluid filling the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. The pressure balancing system 304 is closed loop system that is an adjacently located or remote system that functions to maintain an appropriate fluid presence and pressure at the fluid exchange sealed entrance assembly 408 and the fluid exchange sealed exhaust assembly 406 for one or more sealed enclosures via connecting lines.

The pressure balancing system 304 is capable of supplying fluid pressure to the innermost volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the innermost volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from innermost volume 150 of the sealed enclosure into the fluid pressure collection functionality of the pressure balancing system 304 when the fluid pressure in the innermost volume 150 of the sealed enclosure rises above a specified value thereby lowering the fluid pressure in the innermost volume 150 of the sealed enclosure to maintain a maximum allowable fluid pressure. The fluid exchange sealed exhaust assembly 406 may be located either inside or outside the sealed enclosure. An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure. Optional mechanisms may be additionally configured in the innermost volume 150 of the sealed enclosure in order to effect the circulation of the primary dielectric thermally conductive fluid 106 for the purpose of circulating the primary dielectric thermally conductive fluid in order to more effectively transfer thermal energy from the enclosed electronic devices 104 to the primary dielectric thermally conductive fluid 106 and the innermost enclosure wall 101, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 5:
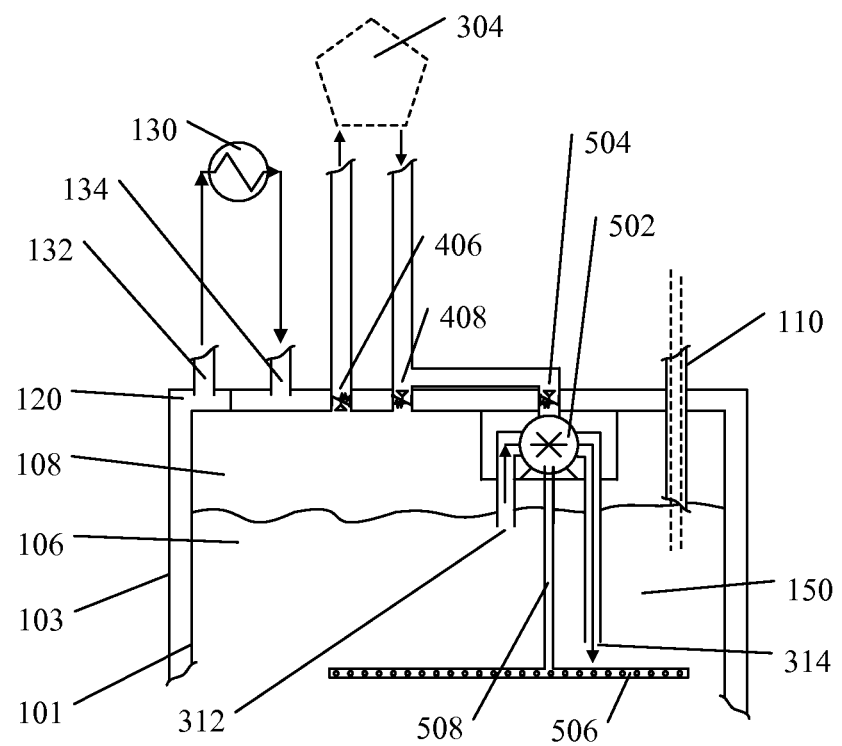
FIG. 5 shows a conceptual view of a dual port pressure balancing mechanism used to relieve positive and negative pressures in a sealed enclosure and optional pressurized gaseous fluid driven primary dielectric thermally conductive fluid pump and bubbler circulation mechanisms according to an embodiment of the disclosed subject matter.

FIG. 5 shows a conceptual view of a dual port pressure balancing mechanism used to relieve positive and negative pressures in a sealed enclosure and optional pressurized gaseous fluid driven primary dielectric thermally conductive fluid pump and bubbler circulation mechanisms. The sealed enclosure shown in the figure is typical of the disclosures described herein (FIG. 1, 2) and is illustrated by showing only a portion of such sealed enclosure as a figure with an innermost enclosure wall 101 and an outermost enclosure wall 103, wherein the innermost volume contains the primary dielectric thermally conductive fluid 106 that either completely or partially fills the interior of the sealed enclosure as shown. The fluid exchange sealed entrance assembly 408 and the fluid exchange sealed exhaust assembly 406 work in concert to allow primary dielectric thermally conductive fluid 106 fluid to be exchanged between the sealed enclosure and a pressure balancing system 304, maintaining a sealed enclosure environment and functioning for the purpose of pressure equalization of the innermost volume 150 of the sealed enclosure, providing optional fluid management, and providing optional motive force to kinetic processes located in the innermost volume 150 of the sealed enclosure. The fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of innermost volume 150 with the remaining volume filled by a separate and distinct fluid in the gaseous phase 108, b) a single phase thermally conductive fluid 106 in the gaseous phase, said fluid filling the entirety of innermost volume 150, or c) a multi-phase primary dielectric thermally conductive fluid 106, said fluid filling the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. The pressure balancing system 304 is closed loop system that is an adjacently located or remote system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 is capable of supplying fluid pressure to the innermost volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the innermost volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from innermost volume 150 of the sealed enclosure into the fluid pressure collection functionality of the pressure balancing system 304 when the fluid pressure in the innermost volume 150 of the sealed enclosure rises above a specified value thereby lowering the fluid pressure in the innermost volume 150 of the sealed enclosure to maintain a maximum allowable fluid pressure. The fluid exchange sealed exhaust assembly 406 may be located either inside or outside the sealed enclosure. An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure. An optional mechanism may be additionally configured in the innermost volume 150 of the sealed enclosure in order to effect the circulation of the primary dielectric thermally conductive fluid 106 by using fluid pressure to supply the motive force for optional kinetic processes that include a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the pressure balancing system 304 to be turned on or off, thereby supplying fluid pressure from the pressure balancing system 304 to kinetic processes such as the fluid pressure driven pump 502 and/or the bubbler 506 for the purpose of circulating the primary dielectric thermally conductive fluid 106 in order to more effectively transfer thermal energy from the enclosed electronic devices 104 to the primary dielectric thermally conductive fluid 106 and the innermost enclosure wall 101. Fluid pressure supplied by the pressure balancing system 304 into the innermost volume 150 of the sealed enclosure via the exhaust of the fluid pressure driven pump 502 and/or the bubbler 506 is returned to the pressure balancing system 304 through the fluid exchange sealed exhaust assembly 406. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the innermost volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 6:
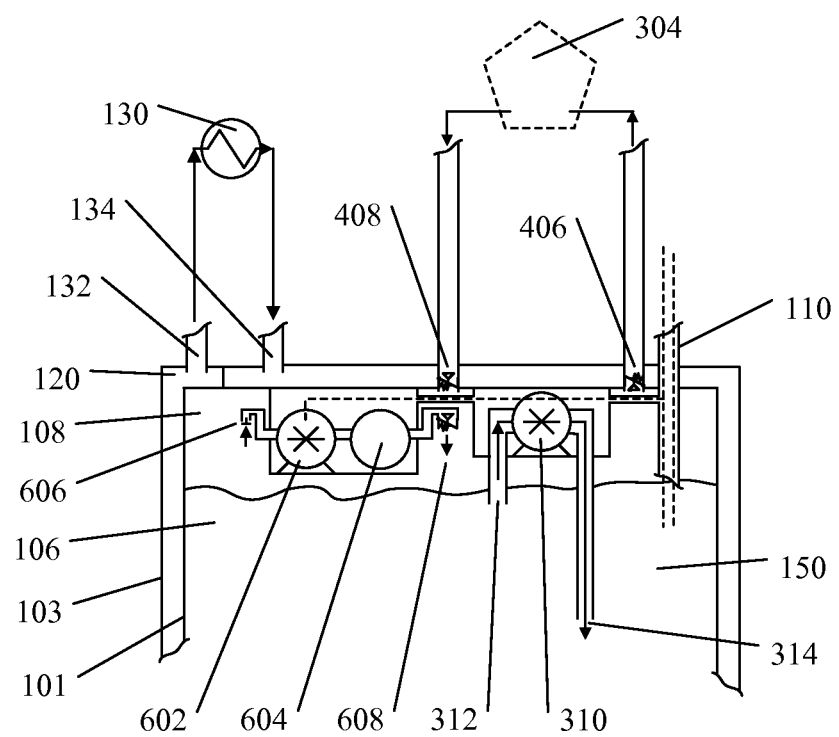
FIG. 6 shows a conceptual view of an internal pressure balancing mechanism with optional dual port pressure balancing mechanism used to relieve positive and negative pressures in a sealed enclosure and optional primary dielectric thermally conductive fluid pump circulation mechanisms according to an embodiment of the disclosed subject matter.

FIG. 6 shows a conceptual view of an internal pressure balancing mechanism with optional dual port pressure balancing mechanism used to relieve positive and negative pressures in a sealed enclosure and optional primary dielectric thermally conductive fluid pump circulation mechanisms. The sealed enclosure shown in the figure is typical of the disclosures described herein (FIG. 1, 2) and is illustrated by showing only a portion of such sealed enclosure as a figure with an innermost enclosure wall 101 and an outermost enclosure wall 103, wherein the innermost volume contains the primary dielectric thermally conductive fluid 106 that either completely or partially fills the interior of the sealed enclosure as shown. Pressure equalization of the innermost volume 150 of the sealed enclosure as well as fluid management is provided by a) one or more first mechanisms comprised of an gaseous fluid compressor 602, pressurized gaseous fluid storage 604, a gaseous fluid entrance assembly 606, a gaseous fluid exhaust assembly 608, and associated connecting lines, valves, and regulators, and b) an optional second mechanism comprised of a fluid exchange sealed entrance assembly 408, a fluid exchange sealed exhaust assembly 406, a pressure balancing system 304, and associated connecting lines, valves, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, a gaseous fluid entrance assembly 606, a gaseous fluid exhaust assembly 608, and/or the fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of innermost volume 150 with the remaining volume filled by a separate and distinct fluid in the gaseous phase 108, b) a single phase thermally conductive fluid 106 in the gaseous phase, said fluid filling the entirety of innermost volume 150, or c) a multi-phase primary dielectric thermally conductive fluid 106, said fluid filling the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. The gaseous fluid compressor 602, pressurized gaseous fluid storage 604, gaseous fluid entrance assembly 606, and gaseous fluid exhaust assembly 608 work in concert to allow excess gaseous fluid that is present in the innermost volume 150 of the sealed enclosure to be compressed and stored for release back into the innermost volume 150 of the sealed enclosure as necessary to maintain a specified range of fluid pressure within the innermost volume 150 of the sealed enclosure. The gaseous fluid entrance assembly 606 may be configured with a check valve that allows only fluid in the gaseous phase to flow into the intake of the gaseous fluid compressor 602. When the fluid pressure in the innermost volume 150 of the sealed enclosure rises above a specified value, the gaseous fluid compressor 602 is activated and gaseous fluid 108 flows from the innermost volume 150 of the sealed enclosure through the gaseous fluid entrance assembly 606 where such gaseous fluid is compressed by the gaseous fluid compressor 602 and stored in pressurized gaseous fluid storage 604 thereby lowering the fluid pressure in the innermost volume 150 of the sealed enclosure to maintain a maximum allowable fluid pressure. The gaseous fluid exhaust assembly 608 is configured with a pressure regulator and a pressure relief valve as to allow gaseous fluid that is stored at high pressures inside pressurized gaseous fluid storage 604 to be released into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 and the fluid exchange sealed exhaust assembly 406 work in concert to allow primary dielectric thermally conductive fluid 106 fluid to be exchanged between the sealed enclosure and a pressure balancing system 304, maintaining a sealed enclosure environment. The pressure balancing system 304 is closed loop system that is an adjacently located or remote system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 is capable of supplying fluid pressure to the innermost volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the innermost volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from innermost volume 150 of the sealed enclosure into the fluid pressure collection functionality of the pressure balancing system 304 when the fluid pressure in the innermost volume 150 of the sealed enclosure rises above a specified value thereby lowering the fluid pressure in the innermost volume 150 of the sealed enclosure to maintain a maximum allowable fluid pressure. The fluid exchange sealed exhaust assembly 406 may be located either inside or outside the sealed enclosure. An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure. Optional mechanisms may be additionally configured in the innermost volume 150 of the sealed enclosure in order to effect the circulation of the primary dielectric thermally conductive fluid 106 for the purpose of circulating the primary dielectric thermally conductive fluid in order to more effectively transfer thermal energy from the enclosed electronic devices 104 to the primary dielectric thermally conductive fluid 106 and the innermost enclosure wall 101, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Figure 7:
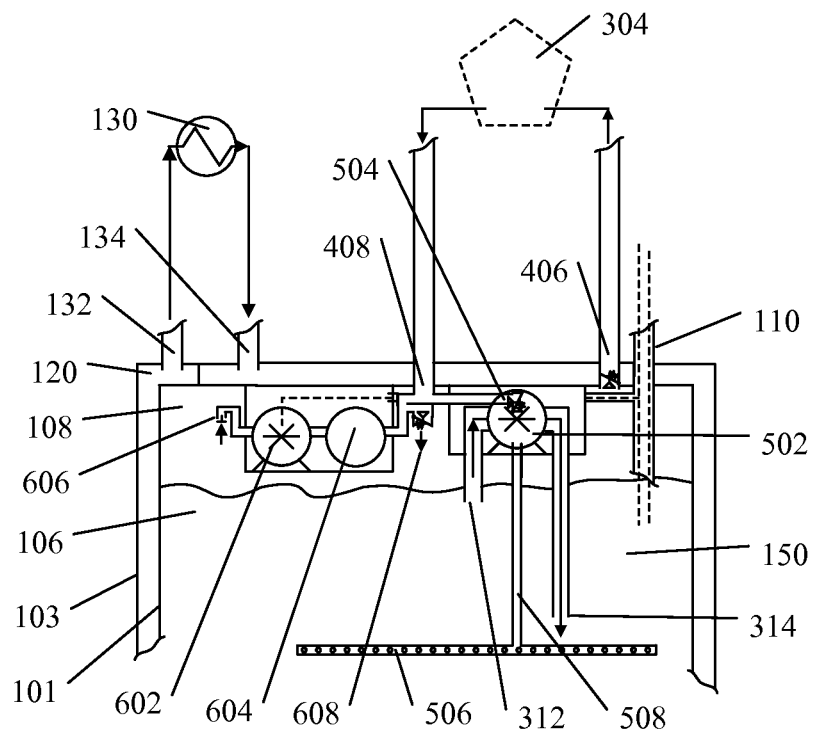
FIG. 7 shows a conceptual view of an internal pressure balancing mechanism with dual port pressure balancing mechanism used to relieve positive and negative pressures in a sealed enclosure and optional pressurized gaseous fluid driven primary dielectric thermally conductive fluid pump and bubbler circulation mechanisms according to an embodiment of the disclosed subject matter.

FIG. 7 shows a conceptual view of an internal pressure balancing mechanism with dual port pressure balancing mechanism used to relieve positive and negative pressures in a sealed enclosure and optional pressurized gaseous fluid driven primary dielectric thermally conductive fluid pump and bubbler circulation mechanisms. The sealed enclosure shown in the figure is typical of the disclosures described herein (FIG. 1, 2) and is illustrated by showing only a portion of such sealed enclosure as a figure with an innermost enclosure wall 101 and an outermost enclosure wall 103, wherein the innermost volume contains the primary dielectric thermally conductive fluid 106 that either completely or partially fills the interior of the sealed enclosure as shown. Pressure equalization of the innermost volume 150 of the sealed enclosure as well as fluid management is provided by a) one or more first mechanisms comprised of an gaseous fluid compressor 602, pressurized gaseous fluid storage 604, a gaseous fluid entrance assembly 606, a gaseous fluid exhaust assembly 608, and associated connecting lines, valves, and regulators, and b) an optional second mechanism comprised of a fluid exchange sealed entrance assembly 408, a fluid exchange sealed exhaust assembly 406, a pressure balancing system 304, and associated connecting lines, valves, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, a gaseous fluid entrance assembly 606, a gaseous fluid exhaust assembly 608, and/or the fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a single phase primary dielectric thermally conductive fluid 106 in the liquid phase, said fluid filling less than the entirety of innermost volume 150 with the remaining volume filled by a separate and distinct fluid in the gaseous phase 108, b) a single phase thermally conductive fluid 106 in the gaseous phase, said fluid filling the entirety of innermost volume 150, or c) a multi-phase primary dielectric thermally conductive fluid 106, said fluid filling the entirety of innermost volume 150 with portions of said fluid existing in the liquid phase 106 and portions of said fluid existing in the gaseous phase 108 in varying proportions relative to the temperature, pressure, and composition of said multi-phase primary dielectric thermally conductive fluid 106. The gaseous fluid compressor 602, pressurized gaseous fluid storage 604, gaseous fluid entrance assembly 606, and gaseous fluid exhaust assembly 608 work in concert to allow excess gaseous fluid that is present in the innermost volume 150 of the sealed enclosure to be compressed and stored for release back into the innermost volume 150 of the sealed enclosure as necessary to maintain a specified range of fluid pressure within the innermost volume 150 of the sealed enclosure. The gaseous fluid entrance assembly 606 may be configured with a check valve that allows only fluid in the gaseous phase to flow into the intake of the gaseous fluid compressor 602. When the fluid pressure in the innermost volume 150 of the sealed enclosure rises above a specified value, the gaseous fluid compressor 602 is activated and gaseous fluid 108 flows from the innermost volume 150 of the sealed enclosure through the gaseous fluid entrance assembly 606 where such gaseous fluid is compressed by the gaseous fluid compressor 602 and stored in pressurized gaseous fluid storage 604 thereby lowering the fluid pressure in the innermost volume 150 of the sealed enclosure to maintain a maximum allowable fluid pressure. The gaseous fluid exhaust assembly 608 is configured with a pressure regulator and a pressure relief valve as to allow gaseous fluid that is stored at high pressures inside pressurized gaseous fluid storage 604 to be released into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 and the fluid exchange sealed exhaust assembly 406 work in concert to allow primary dielectric thermally conductive fluid 106 fluid to be exchanged between the sealed enclosure and a pressure balancing system 304, maintaining a sealed enclosure environment. The pressure balancing system 304 is closed loop system that is an adjacently located or remote system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 is capable of supplying fluid pressure to the innermost volume 150 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the innermost volume 150 of the sealed enclosure when the fluid pressure in the innermost volume 150 of the sealed enclosure falls below a specified value thereby raising the fluid pressure in the innermost volume 150 of the sealed enclosure to maintain a minimum allowable fluid pressure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the innermost volume 150 of the sealed enclosure using the fluid exchange sealed exhaust assembly 406 via connecting lines. The fluid exchange sealed exhaust assembly 406 may be configured with a pressure relief valve assembly that allows fluid pressure to be released from innermost volume 150 of the sealed enclosure into the fluid pressure collection functionality of the pressure balancing system 304 when the fluid pressure in the innermost volume 150 of the sealed enclosure rises above a specified value thereby lowering the fluid pressure in the innermost volume 150 of the sealed enclosure to maintain a maximum allowable fluid pressure. The fluid exchange sealed exhaust assembly 406 may be located either inside or outside the sealed enclosure. An extended surface configuration of the fluid exchange sealed exhaust assembly 406 may be positioned either inside or outside of the sealed enclosure and is comprised of thermally conductive materials configured an extended surface area to effect supplement heat removal from the primary dielectric thermally conductive fluid 106, 108 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the primary dielectric thermally conductive fluid 106, 108 that is transported through the fluid exchange sealed exhaust assembly 406. This extended surface configuration of the fluid exchange sealed exhaust assembly 406 may be utilized to condense multi-phase primary dielectric thermally conductive fluid from the gaseous phase 108 back into the liquid phase 106, with the result of returning such multi-phase primary dielectric thermally conductive fluid 106 in the liquid phase back into the sealed enclosure by gravity flow or other mechanical means in order to maintain a proper amount of primary dielectric thermally conductive fluid 106 within the sealed enclosure. An optional mechanism may be additionally configured in the innermost volume 150 of the sealed enclosure in order to effect the circulation of the primary dielectric thermally conductive fluid 106 by using fluid pressure to supply the motive force for optional kinetic processes that comprise a) fluid circulation by means of a fluid pressure driven pump 502, b) fluid circulation by means of a bubbler 506, c) fluid circulation by means of both a fluid pressure driven pump 502 and a bubbler 506, or d) other fluid circulation mechanisms. These optional motive force mechanisms are driven by pressured fluid supplied by a) pressurized gaseous fluid storage 604, and/or b) the pressure balancing system 304 to the motive force sealed entrance assembly 504 via connecting lines. The motive force sealed entrance assembly 504 may be optionally configured with a pressure regulator allowing the motive force fluid pressure source to supply a high pressure fluid to said pressure regulator which reduces the fluid pressure to appropriate fluid pressure level for the proper operation of the fluid pressure driven kinetic processes. The motive force sealed entrance assembly 504 may be configured with a pressure control valve assembly that allows fluid pressure from the motive force fluid pressure source to be turned on or off, thereby supplying fluid pressure from the motive force fluid pressure source to kinetic processes such as the fluid pressure driven pump 502 and/or the bubbler 506 for the purpose of circulating the primary dielectric thermally conductive fluid 106 in order to more effectively transfer thermal energy from the enclosed electronic devices 104 to the primary dielectric thermally conductive fluid 106 and the innermost enclosure wall 101. Fluid pressure supplied by the motive force fluid pressure source into the innermost volume 150 of the sealed enclosure via the exhaust of the fluid pressure driven pump 502 and/or the bubbler 506 is managed by the designated pressure balancing system. Embodiments that circulate the primary dielectric thermally conductive fluid 106 via a pumping action are comprised of a fluid pressure driven pump 502 connected to the motive force sealed entrance assembly 504, a pump intake 312, and a pump discharge 314. Embodiments that circulate the primary dielectric thermally conductive fluid 106 via a bubbling action are comprised of a bubbler 506 connected to the motive force sealed entrance assembly 504, and a bubbler connecting line 508, said bubbler 506 located in the lower part of the innermost volume 150 of the sealed enclosure and comprising a mechanical means of releasing a pressured fluid in a predominately gaseous phase via a number of bubbler pores of various sizes. If the bubbler 506 and the fluid pressure driven pump 502 are both configured in an embodiment, the fluid pressure utilized to drive the bubbler 506 is supplied by the discharge fluid pressure of the fluid pressure driven pump 502 via connection lines 508. The motive force sealed entrance assembly 504 may be located either inside or outside the sealed enclosure.

Figure 8:
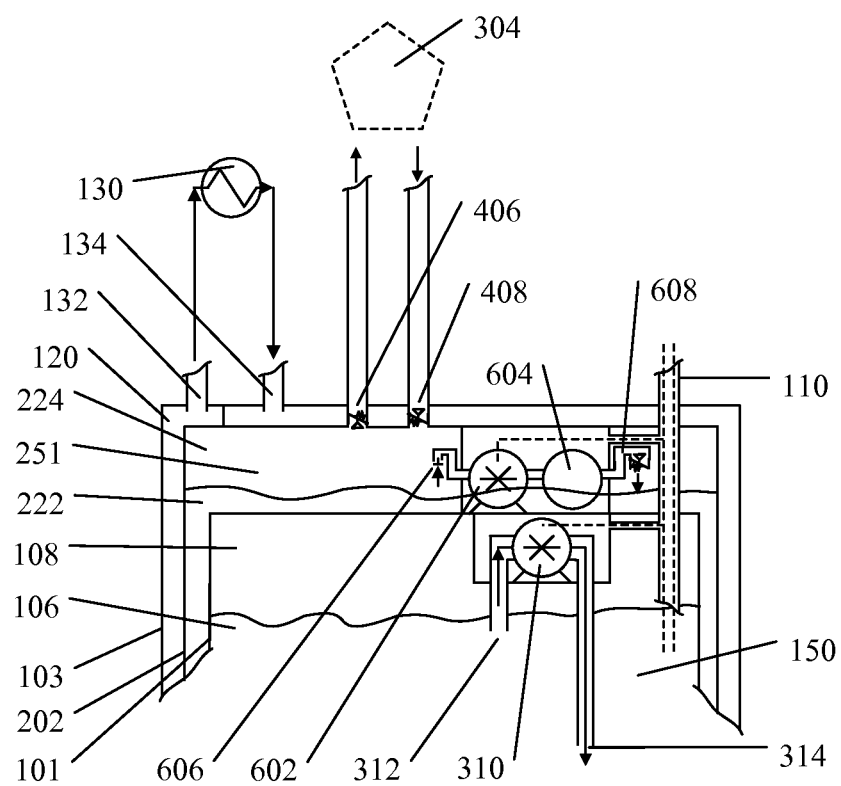
FIG. 8 shows a conceptual view of a dual port pressure balancing mechanism and/or an internal pressure balancing mechanism used to relieve positive and negative pressures in the intermediate wall of a sealed enclosure and optional primary dielectric thermally conductive fluid pump circulation mechanisms according to an embodiment of the disclosed subject matter.

FIG. 8 shows a conceptual view of a dual port pressure balancing mechanism and/or an internal pressure balancing mechanism used to relieve positive and negative pressures in the intermediate wall of a sealed enclosure and optional primary dielectric thermally conductive fluid pump circulation mechanisms. The sealed enclosure shown in the figure is typical of the disclosure described herein (FIG. 2) and is illustrated by showing only a portion of such sealed enclosure as a figure with an innermost enclosure wall 101, intermediate enclosure wall 202, and an outermost enclosure wall 103, wherein the innermost volume 150 contains the primary dielectric thermally conductive fluid 106 that either completely or partially fills the innermost volume 150 of the sealed enclosure and wherein the intermediate volume 251 contains the secondary intermediate thermally conductive fluid 222 that either completely or partially fills the intermediate volume 251 of the sealed enclosure. This embodiment is illustrated to disclosure various aspects of embodiments of pressure balancing, fluid management, and fluid circulation mechanisms configured for multiple wall sealed enclosures as shown in FIG. 2. One skilled in the art, using this disclosure, could develop additional embodiments applying the disclosures in FIG. 3, 4, 5, 6, 7 to sealed enclosures as described in FIG. 2. Pressure equalization of the intermediate volume 251 of the sealed enclosure as well as fluid management is provided by a) an optional one or more first mechanisms comprised of a gaseous fluid compressor 602, pressurized gaseous fluid storage 604, a gaseous fluid entrance assembly 606, a gaseous fluid exhaust assembly 608, and associated connecting lines, valves, and regulators, or b) an optional second mechanism comprised of a fluid exchange sealed entrance assembly 408, a fluid exchange sealed exhaust assembly 406, a pressure balancing system 304, and associated connecting lines, valves, and regulators such that if said first mechanisms and said second mechanism are present in an embodiment, one of the said mechanisms may be designated as the primary functional mechanism while the remaining said mechanisms are designated as secondary functional mechanisms, or all of the said mechanisms may be designated as the primary functional mechanisms. The gaseous fluid compressor 602, pressurized gaseous fluid storage 604, a gaseous fluid entrance assembly 606, a gaseous fluid exhaust assembly 608, and/or the fluid exchange sealed entrance assembly 408, the fluid exchange sealed exhaust assembly 406, and the pressure balancing system 304 may be configured to function with any primary dielectric thermally conductive fluid, but is used advantageously in the embodiments that contain a) a secondary intermediate single phase thermally conductive fluid 222 in the liquid phase, said fluid filling less than the entirety of intermediate volume 251 with the remaining volume filled by a separate and distinct fluid in the gaseous phase 224, b) a secondary intermediate single phase thermally conductive fluid 222 in the gaseous phase, said fluid filling the entirety of intermediate volume 251, or c) a secondary intermediate single phase thermally conductive fluid 222, said fluid filling the entirety of intermediate volume 251 with portions of said fluid existing in the liquid phase 222 and portions of said fluid existing in the gaseous phase 224 in varying proportions relative to the temperature, pressure, and composition of said secondary intermediate single phase thermally conductive fluid 222. The gaseous fluid compressor 602, pressurized gaseous fluid storage 604, gaseous fluid entrance assembly 606, and gaseous fluid exhaust assembly 608 work in concert to allow excess gaseous fluid that is present in the intermediate volume 251 of the sealed enclosure to be compressed and stored for release back into the intermediate volume 251 of the sealed enclosure as necessary to maintain a specified range of fluid pressure within the intermediate volume 251 of the sealed enclosure. The gaseous fluid entrance assembly 606 may be configured with a check valve that allows only fluid in the gaseous phase to flow into the intake of the gaseous fluid compressor 602. When the fluid pressure in the intermediate volume 251 of the sealed enclosure rises above a specified value, the gaseous fluid compressor 602 is activated and the gaseous fluid 224 flows from the intermediate volume 251 of the sealed enclosure through the gaseous fluid entrance assembly 606 where such gaseous fluid is compressed by the gaseous fluid compressor 602 and stored in pressurized gaseous fluid storage 604 thereby lowering the fluid pressure in the intermediate volume 251 of the sealed enclosure to maintain a maximum allowable fluid pressure. The gaseous fluid exhaust assembly 608 is configured with a pressure regulator and a pressure relief valve as to allow gaseous fluid that is stored at high pressures inside pressurized gaseous fluid storage 604 to be released into the intermediate volume 251 of the sealed enclosure when the fluid pressure in the intermediate volume 251 of the sealed enclosure falls below a specified value thereby raising the fluid pressure in the intermediate volume 251 of the sealed enclosure to maintain a minimum allowable fluid pressure. The fluid exchange sealed entrance assembly 408 and the fluid exchange sealed exhaust assembly 406 work in concert to allow secondary intermediate thermally conductive fluid 222 fluid to be exchanged between the sealed enclosure and a pressure balancing system 304, maintaining a sealed enclosure environment. The pressure balancing system 304 is closed loop system that is an adjacently located or remote system that functions to maintain an appropriate fluid presence and pressure at the fluid exchange sealed entrance assembly 408 and the fluid exchange sealed exhaust assembly 406 for one or more sealed enclosures via connecting lines. The pressure balancing system 304 is capable of supplying fluid pressure to the intermediate volume 251 of the sealed enclosure using the fluid exchange sealed entrance assembly 408 via connecting lines. The fluid exchange sealed entrance assembly 408 may be configured with a pressure relief valve assembly that allows fluid pressure to be released from the pressure balancing system 304 into the intermediate volume 251 of the sealed enclosure when the fluid pressure in the intermediate volume 251 of the sealed enclosure falls below a specified value thereby raising the fluid pressure in the intermediate volume 251 of the sealed enclosure to maintain a minimum allowable fluid pressure. The fluid exchange sealed entrance assembly 408 may be optionally configured with a pressure regulator allowing the pressure balancing system 304 to distribute a high fluid pressure to said pressure regulator which reduces the fluid pressure to appropriate fluid pressure level for proper pressure relief valve operation. The fluid exchange sealed entrance assembly 408 may be located either inside or outside the sealed enclosure. The pressure balancing system 304 is capable of removing fluid pressure from the intermediate volume 251 of the sealed enclosure using the fluid exchange sealed exhaust assembly 406 via connecting lines. The fluid exchange sealed exhaust assembly 406 may be configured with a pressure relief valve assembly that allows fluid pressure to be released from intermediate volume 251 of the sealed enclosure into the fluid pressure collection functionality of the pressure balancing system 304 when the fluid pressure in the intermediate volume 251 of the sealed enclosure rises above a specified value thereby lowering the fluid pressure in the intermediate volume 251 of the sealed enclosure to maintain a maximum allowable fluid pressure. The fluid exchange sealed exhaust assembly 406 may be located either inside or outside the sealed enclosure. An extended surface configuration of the fluid exchange sealed exhaust assembly 406 may be positioned either inside or outside of the sealed enclosure and is comprised of thermally conductive materials configured an extended surface area to effect supplement heat removal from the secondary intermediate thermally conductive fluid 222, 224 that is transported through the fluid exchange sealed exhaust assembly 406. Such extended surface configuration of the fluid exchange sealed exhaust assembly 406 is cooled by the secondary thermally conductive fluid 120 that is returned from the secondary fluid heat exchanger 130 via connecting line 134 and flows over the extended surface configuration of the fluid exchange sealed exhaust assembly 406. The flow of cooled secondary thermally conductive fluid 120 over the extended surface configuration of the fluid exchange sealed exhaust assembly 406 serves to remove heat from the secondary thermally conductive fluid 222, 224 that is transported through the fluid exchange sealed exhaust assembly 406. This extended surface configuration of the fluid exchange sealed exhaust assembly 406 may be utilized to condense multiphase primary dielectric thermally conductive fluid from the gaseous phase 224 back into the liquid phase 222, with the result of returning such secondary intermediate thermally conductive fluid 222 in the liquid phase back into the sealed enclosure by gravity flow or other mechanical means in order to maintain a proper amount of secondary intermediate thermally conductive fluid 222 within the sealed enclosure. Pressure equalization of the innermost volume 150 of the sealed enclosure as well as fluid management may be provided for by applying any of the disclosures in FIGS. 3, 4, 5, 6, 7 to innermost volume 150 of the sealed enclosure. Optional mechanisms may be additionally configured in the innermost volume 150 of the sealed enclosure in order to effect the circulation of the primary dielectric thermally conductive fluid 106 for the purpose of circulating the primary dielectric thermally conductive fluid in order to more effectively transfer thermal energy from the enclosed electronic devices 104 to the primary dielectric thermally conductive fluid 106 and the innermost enclosure wall 101, embodiments of such mechanisms comprise a) a mechanism comprised of a fluid pump 310, a pump intake 312, and a pump discharge 314, or b) a mechanism comprised of an impeller, fan, turbine, or propeller that rotates under motive force.

Although example diagrams to implement the elements of the disclosed subject matter have been provided, one skilled in the art, using this disclosure, could develop additional embodiments to practice the disclosed subject matter and each is intended to be included herein.

In addition to the above described embodiments, those skilled in the art will appreciate that this disclosure has application in a variety of arts and situations and this disclosure is intended to include the same.

What is claimed is:
1. A system for facilitating transfer of thermal energy from an innermost volume of a containment vessel, said system comprising:
said containment vessel enclosing the innermost volume, said innermost volume being sealed;

a primary dielectric thermally conductive fluid at least partially filling said innermost volume of said containment vessel;

at least one heat-generating electronic device disposed within said sealed innermost volume of said containment vessel;

at least one secondary thermally conductive fluid disposed between an innermost wall and an outermost wall such that said at least one secondary thermally conductive fluid at least partially fills at least one outermost volume exterior to said innermost wall and interior to said outermost wall of said containment vessel;

at least one secondary fluid fluid-tight entrance through said outermost wall to said at least one outermost volume;

at least one pressure balancing mechanism comprising at least one of:
an innermost pressure balancing mechanism for maintaining at least one of a pressure or a fluid level of said primary dielectric thermally conductive fluid within appropriate operational limits of said primary dielectric thermally conductive fluid, said innermost pressure balancing mechanism disposed only within said innermost volume of said containment vessel, wherein said innermost pressure balancing mechanism comprises an innermost gaseous fluid compressor and an innermost pressurized gaseous fluid storage, or
an outermost pressure balancing mechanism for maintaining at least one of a pressure or a fluid level of said at least one secondary thermally conductive fluid within appropriate operational limits of said at least one secondary thermally conductive fluid, said outermost pressure balancing mechanism disposed only within the at least one outermost volume of said containment vessel, wherein said outermost pressure balancing mechanism comprises an outermost gaseous fluid compressor and an outermost pressurized gaseous fluid storage: and at least one access fluid-tight entrance through said outermost wall and said innermost wall of said containment vessel to said innermost volume of said containment vessel for providing access for at least one of: power cable; control cable; data cable; communications cable; or signal cable.

2. The system of claim 1, wherein an interior surface of said innermost wall of said containment vessel comprises at least one channel for directing a flow of said primary dielectric thermally conductive fluid within said innermost volume.

3. The system of claim 1, said containment vessel further comprises at least one intermediate wall dividing said at least one outermost volume of said containment vessel into at least two separate outermost volumes,
wherein when said at least one pressure balancing mechanism is said outermost pressure balancing mechanism, said outermost pressure balancing mechanism is disposed between said innermost wall and said at least one intermediate wall.

4. The system of claim 1, wherein at least one of said primary dielectric thermally conductive fluid or said at least one secondary thermally conductive fluid is a multi-phased fluid.

5. The system of claim 1, wherein said at least one pressure balancing mechanism further comprises an external pressure balancing system including at least one external pressure balancing fluid-tight entrance through said outermost wall of said containment vessel to at least one of:

said innermost volume of said containment vessel for maintaining the at least one of the pressure or the fluid level of said primary dielectric thermally conductive fluid within the appropriate operational limits of said primary dielectric thermally conductive fluid, or said outermost volume of said containment vessel for maintaining the at least one of the pressure or the fluid level of said at least one secondary dielectric thermally conductive fluid within the appropriate operational limits of said at least one secondary dielectric thermally conductive fluid.

6. The system of claim 5, wherein said external pressure balancing system includes an apparatus for accomplishing vapor condensation of at least one of said primary dielectric thermally conductive fluid or said at least one secondary dielectric thermally conductive fluid, said vapor condensation apparatus disposed exterior to said innermost volume of said containment vessel.

7. The system of claim 1, wherein said at least one secondary thermally conductive fluid is circulated away from said containment vessel to a heat exchange unit disposed external to said containment vessel.

8. The system of claim 1, wherein said outermost wall of said containment vessel comprises a thermally insulating material.

9. The system of claim 1, wherein fluid circulation within said innermost volume of said containment vessel is augmented by at least one of: a fluid pump, a fan, a propeller blade, a bubbler, or a kinetic process mechanism.

10. The system of claim 1, wherein said containment vessel has fins affixed to at least one of said innermost wall or said outermost wall of said containment vessel.

11. The system of claim 1, said containment vessel further comprises a means for rendering permanently inoperable said at least one heat-generating electronic device disposed within said containment vessel.

12. The system of claim 1, wherein said at least one pressure balancing mechanism is said innermost pressure balancing mechanism, said containment vessel further comprises an external pressure balancing system including at least one pressure balancing fluid-tight entrance through said outermost wall of said containment vessel to said innermost volume, said external pressure balancing system combines with said innermost pressure balancing mechanism in maintaining the at least one of the pressure or the fluid level of said primary dielectric thermally conductive fluid within the appropriate operational limits of said primary dielectric thermally conductive fluid.

13. The system of claim 12, wherein said external pressure balancing system is a closed system, and wherein one of said innermost pressure balancing mechanism or said external pressure balancing system is a primary pressure balancing system and another of said innermost pressure balancing mechanism or said external pressure balancing system is a secondary pressure balancing system.

14. The system of claim 1, wherein said at least one pressure balancing mechanism is said outermost pressure balancing mechanism, said containment vessel further comprises an external pressure balancing system including at least one pressure balancing fluid-tight entrance through said outermost wall of said containment vessel to said outermost volume, said external pressure balancing system combines with said outermost pressure balancing mechanism in maintaining the at least one of the pressure or the fluid level of said at least one secondary dielectric thermally conductive fluid within the appropriate operational limits of said at least one secondary dielectric thermally conductive fluid.

15. The system of claim 14, wherein said external pressure balancing system is a closed system, and wherein one of said outermost pressure balancing mechanism or said external pressure balancing system is a primary pressure balancing system and another of said outermost pressure balancing mechanism or said external pressure balancing system is a secondary pressure balancing system.

16. A method for facilitating transfer of thermal energy from an innermost volume of a containment vessel, said method comprising:
providing a containment vessel enclosing the innermost volume, said innermost volume being sealed;
providing a primary dielectric thermally conductive fluid at least partially filling said innermost volume of said containment vessel;
disposing at least one heat-generating electronic device within said sealed innermost volume of said containment vessel;
providing at least one secondary thermally conductive fluid between an innermost wall and an outermost wall at least partially filling an outermost volume exterior to said innermost wall and interior to said outermost wall of said containment vessel;
providing at least one secondary fluid fluid-tight entrance through said outermost wall to said at least one outermost volume;
providing at least one pressure balancing mechanism comprising at least one of:
an innermost pressure balancing mechanism for maintaining at least one of a pressure or a fluid level of said primary dielectric thermally conductive fluid within appropriate operational limits of said primary dielectric thermally conductive fluid, said innermost pressure balancing mechanism disposed only within said innermost volume of said containment vessel, wherein said innermost pressure balancing mechanism comprises an innermost gaseous fluid compressor and an innermost pressurized gaseous fluid storage, or
an outermost pressure balancing mechanism for maintaining at least one of a pressure or a fluid level of said at least one secondary thermally conductive fluid within appropriate operational limits of said at least one secondary thermally conductive fluid, said outermost pressure balancing mechanism disposed only within the at least one outermost volume of said containment vessel, wherein said outermost pressure balancing mechanism comprises an outermost gaseous fluid compressor and an outermost pressurized gaseous fluid storage: and
providing at least one access fluid-tight entrance through said outermost wall and said innermost wall of said containment vessel to said innermost volume of said containment vessel for providing access for at least one of: power cable; control cable; data cable; communications cable; or signal cable.

17. The method of claim 16, wherein an interior surface of said innermost wall of said containment vessel comprises at least one channel for directing a flow of said primary dielectric thermally conductive fluid within said innermost volume.

18. The method of claim 16, said containment vessel further comprises at least one intermediate wall dividing said at least one outermost volume of said containment vessel into at least two separate outermost volumes,
wherein when said at least one pressure balancing mechanism is said outermost pressure balancing mechanism, said outermost pressure balancing mechanism is disposed between said innermost wall and said at least one intermediate wall.

19. The method of claim 16, wherein at least one of said primary dielectric thermally conductive fluid or said at least one secondary thermally conductive fluid is a multi-phased fluid.

20. The method of claim 16, said providing said at least one pressure balancing mechanism further comprises providing an external pressure balancing system including at least one external pressure balancing fluid-tight entrance through said outermost wall of said containment vessel to at least one of:
said innermost volume of said containment vessel for maintaining the at least one of the pressure or the fluid level of said primary dielectric thermally conductive fluid within the appropriate operational limits of said primary dielectric thermally conductive fluid, or
said outermost volume of said containment vessel for maintaining the at least one of the pressure or the fluid level of said at least one secondary dielectric thermally conductive fluid within the appropriate operational limits of said at least one secondary dielectric thermally conductive fluid.

21. The method of claim 20, wherein said providing said external pressure balancing system includes an apparatus for accomplishing vapor condensation of at least one of said primary dielectric thermally conductive fluid or said at least one secondary dielectric thermally conductive fluid, said vapor condensation apparatus disposed exterior to said innermost volume of said containment vessel.

22. The method of claim 16, wherein said at least one secondary thermally conductive fluid is circulated away from said containment vessel to a heat exchange unit disposed external to said containment vessel.

23. The method of claim 16, wherein said outermost wall of said containment vessel comprises a thermally insulating material.

24. The method of claim 16, wherein fluid circulation within said innermost volume of said containment vessel is augmented by at least one of: a fluid pump, a fan, a propeller blade, a bubbler, or a kinetic process mechanism.

25. The method of claim 16, wherein said containment vessel has fins affixed to at least one of said innermost wall or said outermost wall of said containment vessel.

26. The method of claim 16, said providing said containment vessel further comprises a means for rendering permanently inoperable said at least one heat-generating electronic device disposed within said containment vessel.

27. The method of claim 16, wherein said providing said at least one pressure balancing mechanism is providing said innermost pressure balancing mechanism, said providing said containment vessel further comprises providing an external pressure balancing system including at least one pressure balancing fluid-tight entrance through said outermost wall of said containment vessel to said innermost volume, said external pressure balancing system combines with said innermost pressure balancing mechanism in maintaining the at least one of the pressure or the fluid level of said primary dielectric thermally conductive fluid within the appropriate operational limits of said primary dielectric thermally conductive fluid.

28. The method of claim 27, wherein said external pressure balancing system is a closed system, and wherein one of said innermost pressure balancing mechanism or said external pressure balancing system is a primary pressure balancing system and another of said innermost pressure balancing mechanism or said external pressure balancing system is a secondary pressure balancing system.

29. The method of claim 16, wherein said providing said at least one pressure balancing mechanism is providing said outermost pressure balancing mechanism, said providing said containment vessel further comprises providing an external pressure balancing system including at least one pressure balancing fluid-tight entrance through said outermost wall of said containment vessel to said outermost volume, said external pressure balancing system combines with said outermost pressure balancing mechanism in maintaining the at least one of the pressure or the fluid level of said at least one secondary dielectric thermally conductive fluid within the appropriate operational limits of said at least one secondary dielectric thermally conductive fluid.

30. The method of claim 29, wherein said external pressure balancing system is a closed system, and wherein one of said outermost pressure balancing mechanism or said external pressure balancing system is a primary pressure balancing system and another of said outermost pressure balancing mechanism or said external pressure balancing system is a secondary pressure balancing system.

\* \* \* \* \*